United States Patent
Myers (10) Patent No.: US 8,742,736 B2
(45) Date of Patent: Jun. 3, 2014

(54) SYSTEM AND METHOD FOR BIASING ANALOG CIRCUITRY IN A DISTRIBUTED POWER DELIVERY NETWORK FOR IMAGE SENSORS AND OTHER CIRCUIT STRUCTURES

(75) Inventor: Charles Myers, Corvallis, OR (US)

(73) Assignee: Aptina Imaging Corporation, George Town (KY)

( * ) Notice: Subject to any disclaimer, the term of this patent is extended or adjusted under 35 U.S.C. 154(b) by 615 days.

(21) Appl. No.: 13/040,525

(22) Filed: Mar. 4, 2011

(65) Prior Publication Data

US 2012/0187936 A1 Jul. 26, 2012

Related U.S. Application Data

(60) Provisional application No. 61/435,676, filed on Jan. 24, 2011.

(51) Int. Cl.
*G05F 1/40* (2006.01)
(52) U.S. Cl.
USPC ............................................. 323/265

(58) Field of Classification Search
CPC .................................. H03F 1/301; G05F 1/08
USPC ........... 323/264, 265, 267; 250/206, 214 SW, 250/208.1, 332
See application file for complete search history.

(56) References Cited

U.S. PATENT DOCUMENTS

| | | | |
|---|---|---|---|
| 6,897,429 B1 * | 5/2005 | Turner et al. | 250/214 R |
| 7,298,344 B2 * | 11/2007 | Brown | 343/797 |
| 7,659,500 B2 * | 2/2010 | Purcell | 250/208.1 |

\* cited by examiner

*Primary Examiner* — Matthew Nguyen
(74) *Attorney, Agent, or Firm* — Michael H. Lyons (57) ABSTRACT

A distributed power supply delivery network includes an analog biased circuit array having current sources for delivering current to adjacent circuits, and a resistive ladder of resistor elements, where each resistor element is disposed between adjacent current sources. A tuned IR voltage drop network is included to match voltage drops across the resistive ladder. The tuned IR voltage drop network includes series connected resistors and a static current draw to induce the IR drop. The resistors may be matched with respect to the distributed power supply delivery system. The current source providing the static current for the IR drop may be programmed based on the power supply delivery load, in order to adjust the voltage drop across the biasing delivery route and match the voltage drop in the referenced power supply.

21 Claims, 6 Drawing Sheets

SYSTEM AND METHOD FOR BIASING ANALOG CIRCUITRY IN A DISTRIBUTED POWER DELIVERY NETWORK FOR IMAGE SENSORS AND OTHER CIRCUIT STRUCTURES

CROSS REFERENCE TO RELATED APPLICATIONS

This application claims priority of U.S. Provisional Patent Application Ser. No. 61/435,676, filed Jan. 24, 2011.

FIELD OF THE INVENTION

The present invention, in general, relates to a distributed power delivery network or system. More specifically, the present invention relates to biasing methods applied to distributed power delivery networks for image sensors and other circuits.

BACKGROUND OF THE INVENTION

Figure 1A:
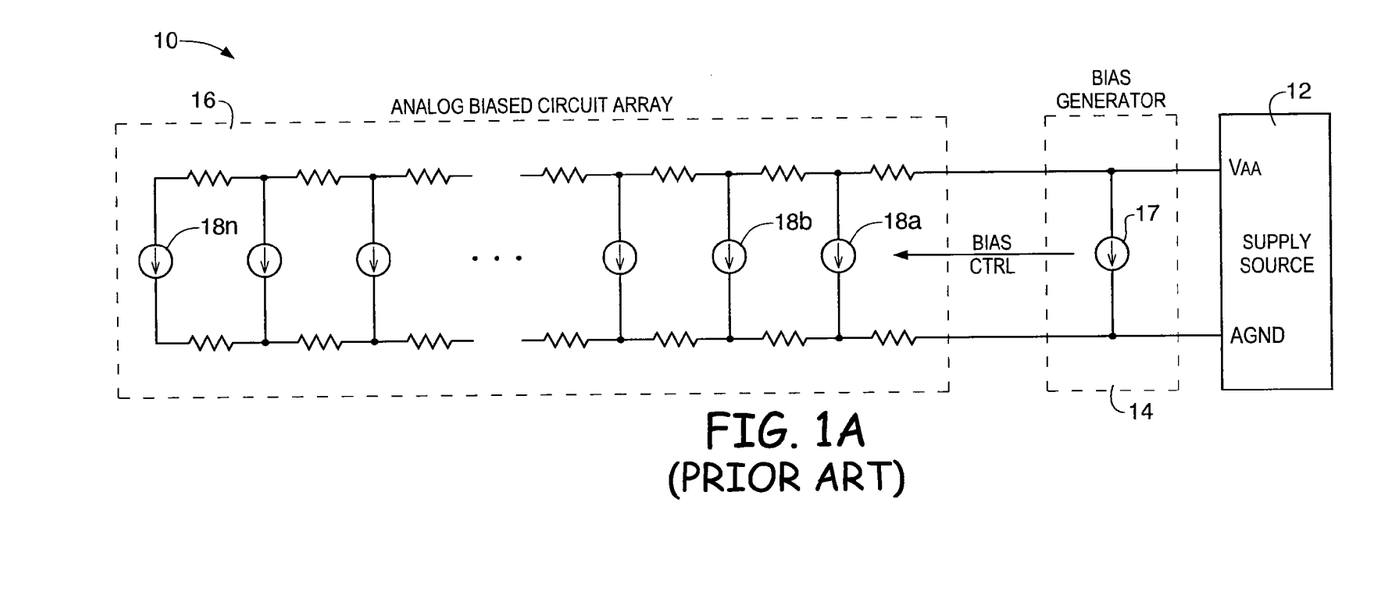
FIG. 1A is a schematic diagram of a conventional distributed power supply delivery network.

A distributed power supply delivery network or system is shown in FIG. 1A, generally designated as 10. As shown, network 10 includes supply source 12, bias generator 14 and an analog biased circuit array 16. The supply source provides a voltage $V_{AA}$ (for example), which is shown referenced to ground, AGND. The bias generator, which is coupled to the supply source, includes a current mirror, generally designated as 17, for providing bias control to several current sources, or current mirrors 18a through 18n, the latter disposed in circuit array 16. As will be appreciated, current sources 17 and 18a through 18n may each include several MOSFET transistors (for example) that are configured for biasing on/off to provide the distributed current sources shown in the figure.

A good example of a distributed power delivery network is the current mirrors used in an image sensor, in which each column of a pixel array includes one or more amplifiers that consumes a static amount of current when enabled. Thus, current sources 18a through 18n, respectively, may provide the currents required to read-out the n-columns of a pixel array of an imager sensor. It will be appreciated that the amplifiers (for example) may be connected in series with each of the current sources 18a through 18n. These amplifiers are not shown in FIG. 1A, but are shown, for example, in FIG. 2A as elements 23, referred to herein as array circuitry 25, or array circuits 25.

Distributed power supply delivery networks, however, experience a non-linear IR voltage drop, whereby the IR voltage drop reduces the bias control voltage to each successive current source, as the distance from the power supply source is increased. A good example of this is the IR voltage drop to each current source of the column amplifiers of an image sensor. The IR voltage drop profile, which is caused by the ladder of resistors shown in FIG. 1A, reduces the bias control voltage, Vgs, to each current source 18. It will be appreciated that the ladder of resistors may be resistor devices, or may simply be the sheet resistance of metal routing in a wafer.

Figure 1B:
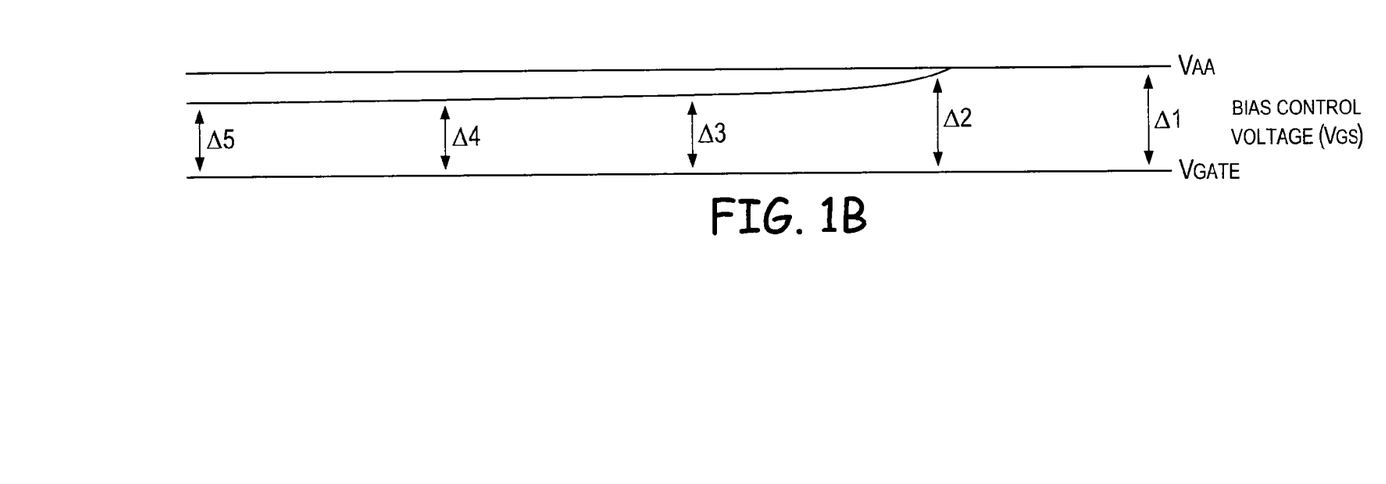
FIG. 1B is a plot of bias control voltage (Vgs) depicting continually reduced voltage potentials, as one moves away from the bias generator shown in FIG. 1A.

This IR voltage drop profile in the power supply (positive or negative supplies) creates difficulties in maintaining uniform bias current levels in the distribution array, as the IR voltage drop induces a change in Vgs between the gate and source of each of the current source MOSFET transistors. This variation may have quite large impacts on the performance of these biased current mirror circuits. As shown in FIG. 1B, the bias control voltage, Vgs, is continuously reduced, as one moves further away from supply source 12 (moving from right to left on the figure). As shown, the voltage $V_{AA}$ is reduced relative to the gate voltage, Vgate, present at each MOSFET transistor of a respective current source, as one moves further away from supply source 12.

One solution to this problem may be to reduce the resistance of the power supply delivery network, thereby reducing the extent of the IR voltage drop. This works for some applications, but is limited to available circuit area for power supply routing. Applications requiring dense circuitry, with relatively high performance requirements, struggle against this tradeoff.

Another solution may be to sample the bias control voltage with sampling capacitors distributed throughout the power distribution array. This only works, however, if the sampling is done before the analog array circuitry is turned on to set-up the non-linear IR voltage drop in the power supply network. This solution effectively maintains a static Vgs voltage on the analog circuitry of the array, as the local power supply network affected by the IR voltage drop (the sampled gate bias voltage) mirrors the movement, thereby maintaining a constant Vgs voltage. This solution forces a trade-off in the cell size of the array (column height in image sensors) for noise, sampling accuracy, and lower leakage. It also introduces a potential source for power supply injection of coherent row-noise, due to the row-wise sampling event.

As will be explained, the present invention, among other benefits, provides a better solution to the aforementioned problem, by reducing the non-linearity in control voltages used to bias the multiple power sources of a distributed power delivery network.

BRIEF DESCRIPTION OF THE FIGURES

It is understood that the following details are examples only and are not restrictive of the invention. The invention may be understood from the following detailed description, when read in connection with the accompanying figures.

DETAILED DESCRIPTION OF THE INVENTION

The present invention provides a matched, or tuned IR voltage drop network, which is used to bias analog circuitry, so the relative bias voltage with respect to the referenced power supply (positive or negative) is closely maintained. The present invention forces a bias current through an embedded resistance network, which matches the IR voltage drop profile of a power supply.

As will be explained, current sources may be placed on either one, or both sides of a distributed power delivery network, in order to provide current to delivery routes on the same, or opposite sides of the delivery network. In addition, the present invention may provide programmed current sources allowing for adjustment, or trimming of the IR voltage drops in the distributed power delivery network. Furthermore, the present invention may provide matched metal resistance to current ratio to ensure relative IR voltage drop matching.

Figure 2A:
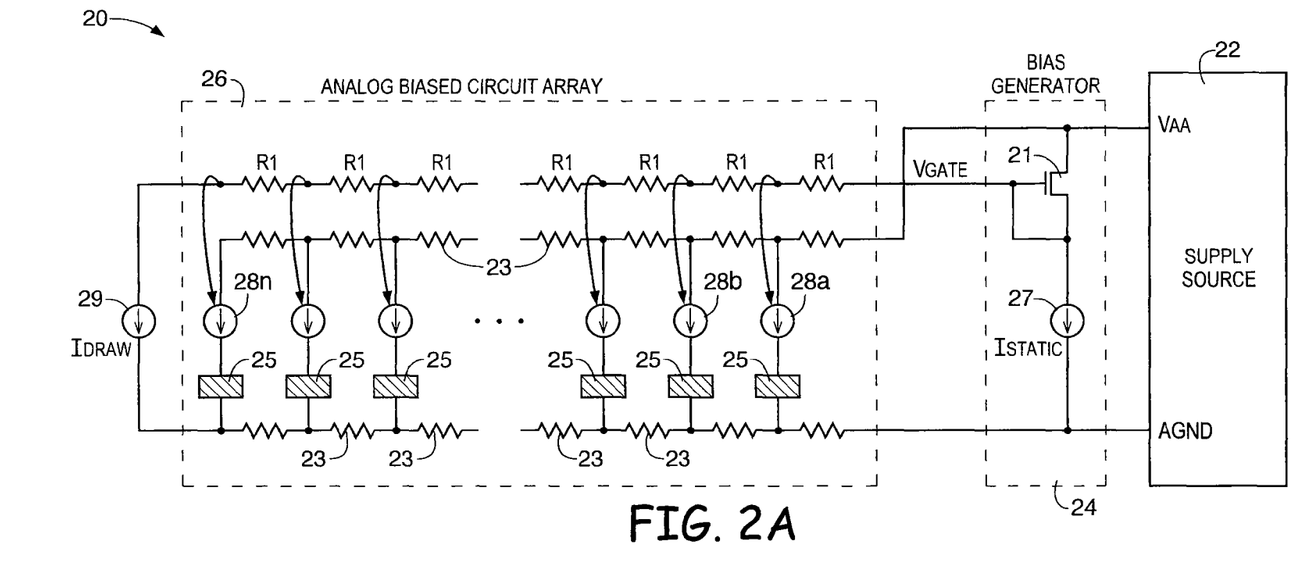
FIG. 2A is a schematic diagram of a distributed power supply delivery network, in which the current mirror control Vgate is controlled in accordance with an example of the present invention.

Referring now to FIG. 2A, there is shown a distributed power supply delivery network, generally designated as 20, in accordance with an example of the present invention. As shown, network 20 includes supply source 22, bias generator 24 having current source 27, analog biased circuit array 26, and a separate current source 29 (provided by the same or similar bias generator 24). The current source 29 is disposed adjacent one side, or one end of circuit array 26; the other current source 27 is disposed adjacent the other side of analog biased circuit array 26.

The generalized distribution network 20 includes a resistive network of series connected resistors R1 that are coupled between bias generator 24 and current source 29 (Idraw). The series connected resistors R1 provide the IR voltage drops across the analog biased circuit array 26, which approximately match the IR voltage drops experienced by the power supply resistive ladder, the latter composed of multiple resistors 23. It will be understood that resistors 23 may include resistor devices, or may simply be the sheet resistance of the metal routed between ends of current sources 28a through 28n. It will also be understood that the series connected block elements 25, each shown connected to a respective current source, represent the array circuitry (for example array amplifiers) powered by the current sources in the analog biased circuit array 26.

The array circuitry 25, which draws power from the analog biased circuit array, is only shown in FIG. 2A. A similar array circuitry 25 may draw power from the analog biased circuit arrays shown in FIGS. 3A, 4A, 5A and 6A. The array circuitry 25, however, has been omitted from these latter figures for the sake of clarity.

A goal of the series connected resistors R1 is to maintain a constant bias control voltage, Vgs, on each current source 28. As such, resistors R1 may include resistor devices, or may simply be sheet metal resistance that match the corresponding resistor devices, or sheet metal resistance formed by resistors 23, the latter disposed along the current delivery routes.

Still referring to FIG. 2A, the current required by bias generator 24 is split between current source 27 (Istatic) and current source 29 (Idraw). Thus, the total current, Ibias, delivered to analog biased circuit array 26 is equal to Istatic+Idraw. The bias generator 24 is thus designed to accommodate the total current of Ibias required to supply analog biased circuit array 26.

The current Idraw may be supplied from a similar bias generator as the one providing the current reference for Istatic. This additional circuitry may be included in bias generator 24 and may be achieved with standard current mirror generation methods. The combination of Idraw and Istatic sets up a potential difference of Vgs between the gate and source of MOSFET transistor 21.

Figure 2B:
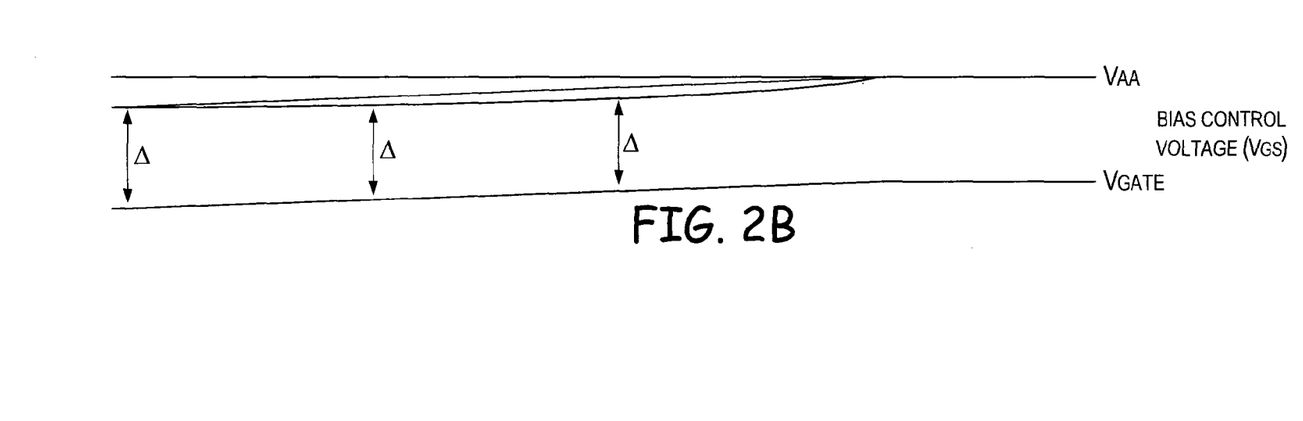
FIG. 2B is a plot of bias control voltage (Vgs) depicting a voltage difference that stays substantially uniform, as one moves away from the bias generator shown in FIG. 2A.

As the current, Idraw, travels through the series connected resistors R1, Idraw generates an IR voltage drop in the Vgate route between MOSFET transistor 21 and ground route (AGND reference) that approximates the IR voltage drop seen in the biased circuit array of the distribution network. The $V_{AA}$ supply reference level drops as the current for sources 28a through 28n travels through the resistive ladder of the analog biased circuit array 26. In a similar manner, the Vgate voltage level also drops, as the Idraw current travels through the series connected resistors R1. This profile is shown in FIG. 2B, which depicts $V_{AA}$ and Vgate voltages dropping in level due to respective IR drops, as one moves from right to left on the figure. Since the IR voltage drops in the $V_{AA}$ route match the IR voltage drops in the Vgate route, the voltage difference ($\Delta$) between the $V_{AA}$ curve and the Vgate curve remains substantially constant along the entire current delivery route.

The result shown in FIG. 2B may be contrasted against the non-uniform voltage differences formed between the $V_{AA}$ curve and the non-changing Vgate curve in FIG. 1B. The non-uniformity is represented by decreasing differences of $\Delta_1$, $\Delta_2$, $\Delta_3$, $\Delta_4$ and $\Delta_5$ when moving from right to left on FIG. 1B.

The biasing circuitry for the power distribution networks, shown in FIGS. 1A and 2A, may be applied to either positive or negative power supply IR voltage drops and, correspondingly, to either PMOS or NMOS bias current sources. Additionally this biasing network may be applied to cascode bias circuits, which require a current source control to maintain a constant Vds on the current supply device. A biasing system for cascode bias current control is shown in FIG. 3A.

Figure 3A:
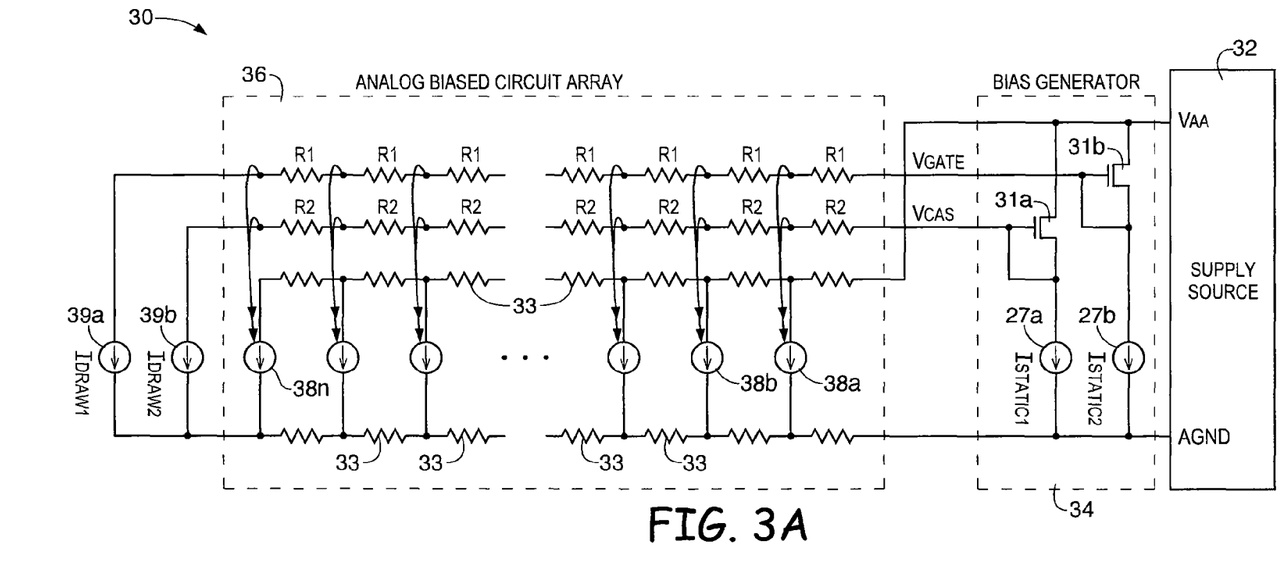
FIG. 3A is a circuit diagram of another distributed power delivery network that is similar to the delivery network shown in FIG. 2A including another bias control voltage of Vcas (Vcascode), in accordance with another example of the present invention.

Referring now to FIG. 3A, there is shown a distributed power supply delivery network, generally designated as 30, in accordance with an example of the present invention. As shown, network 30 includes supply source 32, bias generator 34, analog biased circuit array 36, and two separate current sources 39a and 39b, the latter two sources disposed adjacent a side of circuit array 36. While current sources 39a and 39b are disposed adjacent one side of circuit array 36, the other current sources 27a and 27b are disposed adjacent the other side of analog biased circuit array 36. It will be understood that current sources 39a and 39b, as well as current sources 27a and 27b are herein considered part of bias generator 34, in the sense that they supply all the necessary current for biasing current sources 38a through 38b.

The generalized distribution network 30 includes two resistive networks. The first resistive network includes series connected resistors R1 that are coupled between current source 39a (Idraw1) and MOSFET transistor 31b. The second resistive network of series connected resistors R2 are coupled between MOSFET transistor 31a of bias generator 34 and current source 39b (Idraw2). The series coupled resistors R1 and the series connected resistors R2 provide IR voltage drops across the ends of the layout of analog biased circuit array 36. The IR voltage drops of resistors R1 and R2 approximately match the IR voltage drops experienced by the power supply resistive ladder, which is composed of multiple resistors 33.

A goal of the series connected resistors R1 and the series connected resistors R2 is to maintain a constant bias control voltage, Vgs, and a constant cascode bias control voltage, Vds, at each current source 28. It will be appreciated that series connected resistors R1 and/or R2 may include resistor devices or simply may be sheet metal resistances that match the corresponding resistor devices or sheet metal resistances of the power supply resistive ladder that is disposed along the current delivery routes of Vgate and Vcas.

The current required from bias generator 34 to power the current mirrors is split between current sources 27a and 27b (Istatic1 and Istatic2) and current sources 39a and 39b (Idraw1 and Idraw2). The total Ibias current supplied by bias generator 34 for the current mirror and current mirror cascode are the sum of Istatic1 and Idraw1 and the sum of Istatic2 and Idraw2, respectively.

Figure 3B:
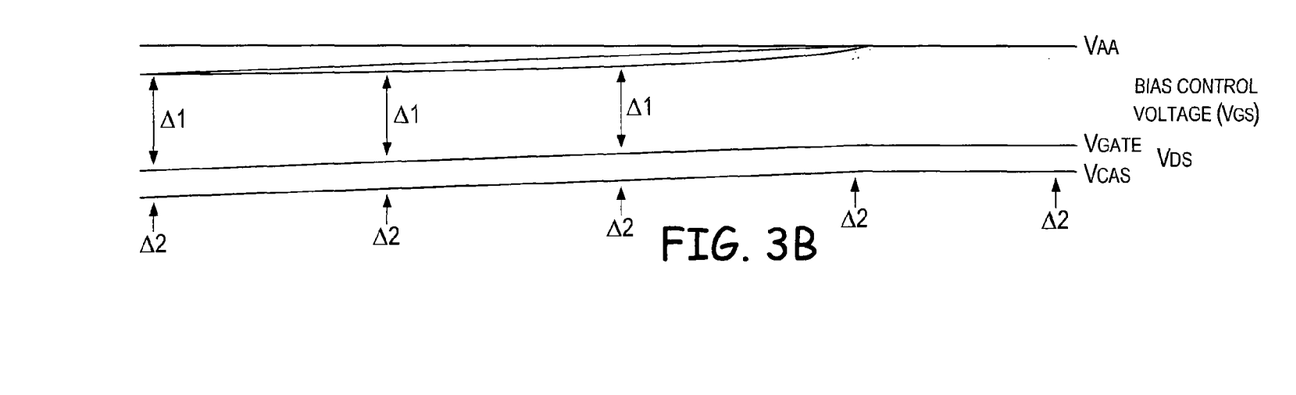
FIG. 3B is a plot of the changes in the voltage levels of the bias control voltages of Vgate and Vcas, respectively, as one moves away from the bias generator shown in FIG. 3A.

Referring next to FIG. 3B, there are shown plots of the supply voltage V$_{AA}$, the gate voltage Vgate and the cascode voltage Vcas. As shown, the respective voltage drop differences, as one moves from right to left on the figure, are maintained substantially constant across the analog biased circuit array 36. The voltage drop difference for Vgs is shown as $\Delta_1$ and the voltage drops difference for Vds is shown as $\Delta_2$.

The Idraw current (in the Vgate path and/or the Vcas path) supplied from the bias generator may be programmed to allow for trimming of the IR voltage drop, depending on the accuracy of the matched resistance route (in the series connected resistors) to the power supply. Additionally, the programming may be used to adjust the IR voltage drop, as the power consumption requirement of the power distribution array changes over different operating modes. The Istatic current source (Istatic1 and/or Istatic2) may also be programmed to offset current added or removed from the Idraw current source (Idraw1 and/or Idraw2) in order to maintain a constant total current Ibias.

To help improve the matching of the metal routes, identical ratios of like metals used in the power supply route may be used in the Vgate route. For example, if the M4 to M3 ratio of metal route for the power supply is 2:1, then the same 2:1 M4 to M3 ratio of metal route may be used for the Vgate route, in order to more closely match the resistance of the routes over any process drift.

The Idraw current source may also be placed on the same end (or side) of the analog biased circuit array by placing the Idraw current source adjacent to the Istatic current source in the bias generator. This provides for easier fabrication design. The current provided by the Idraw current source is then routed to the other end (or side) of the circuit array by way of a metal route. This sets up the IR voltage drop in the proper direction. This is shown by the network shown in FIG. 4A.

Figure 4A:
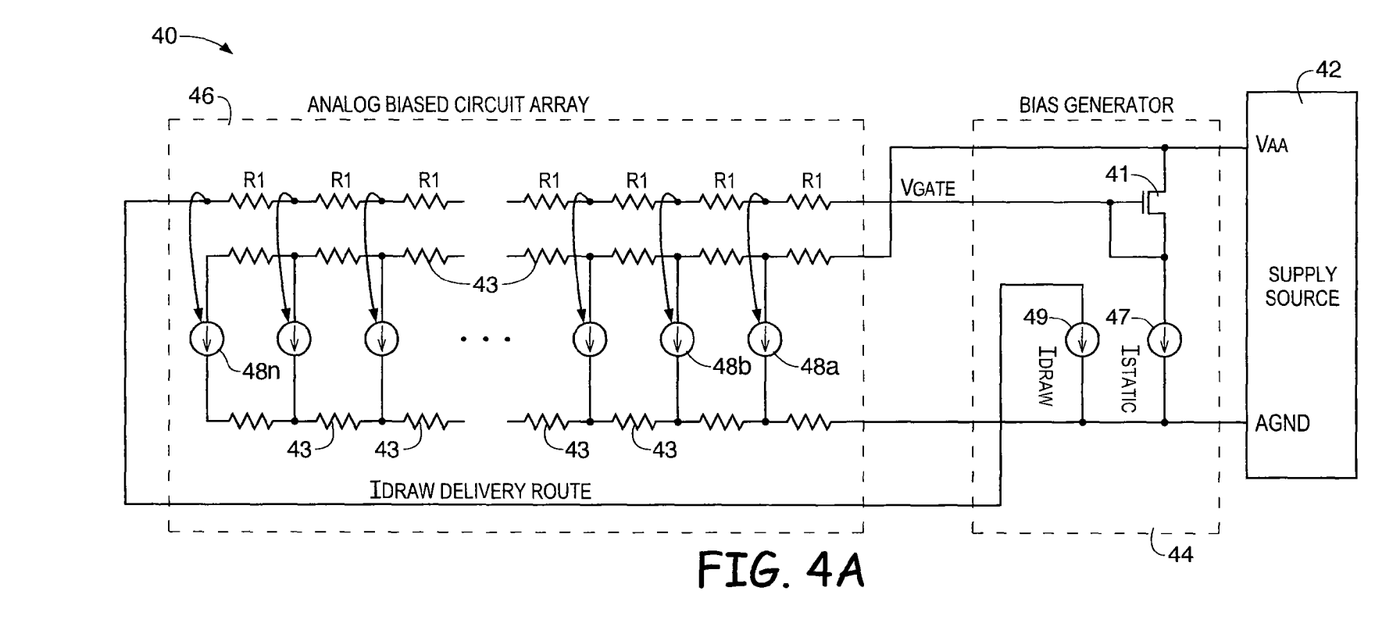
FIG. 4A is a schematic diagram of yet another distributed power supply delivery network, in which the bias generator includes two current sources disposed adjacent one end of the analog biased circuit array, in accordance with yet another example of the present invention.

Referring now to FIG. 4A, there is shown a distributed power supply delivery network, generally designated as 40, in accordance with an example of the present invention. As shown, network 40 includes supply source 42, bias generator 44 and analog bias circuit array 46. The bias generator includes current source (Istatic) 47 and current source (Idraw) 49, both sources shown disposed adjacent each other and adjacent one end of circuit array 46.

The generalized distribution network 40 includes a resistive network of series connected resistors R1 that are coupled between current source 49 (Idraw) and MOSFET transistor 41.

Since current source 49 (Id raw) is disposed within bias generator 44, a separate line designated 'Idraw delivery route' extends between current source 49 and the other end of analog bias circuit array 46, in order to connect to the series connected resistors R1. The series connected resistors R1 closely match the ladder network composed of resistors 43.

Figure 4B:
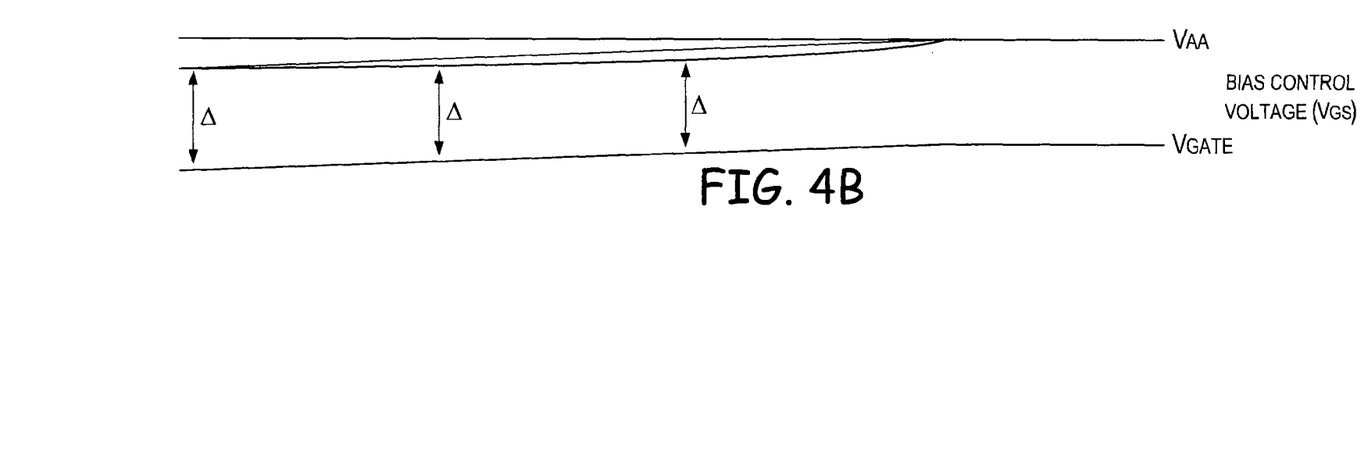
FIG. 4B is a plot of bias control voltage (Vgs) depicting a voltage difference that stays substantially uniform, as one moves away from the bias generator shown in FIG. 4A.

Referring next to FIG. 4B, a profile is shown of the voltage difference ($\Delta$) generated between the supply source V$_{AA}$ and the bias control voltage Vgate. Similar to the profile of FIG. 2B, the voltage difference shown in FIG. 4B is maintained substantially constant, when moving from right to left in the figure.

Figure 5A:
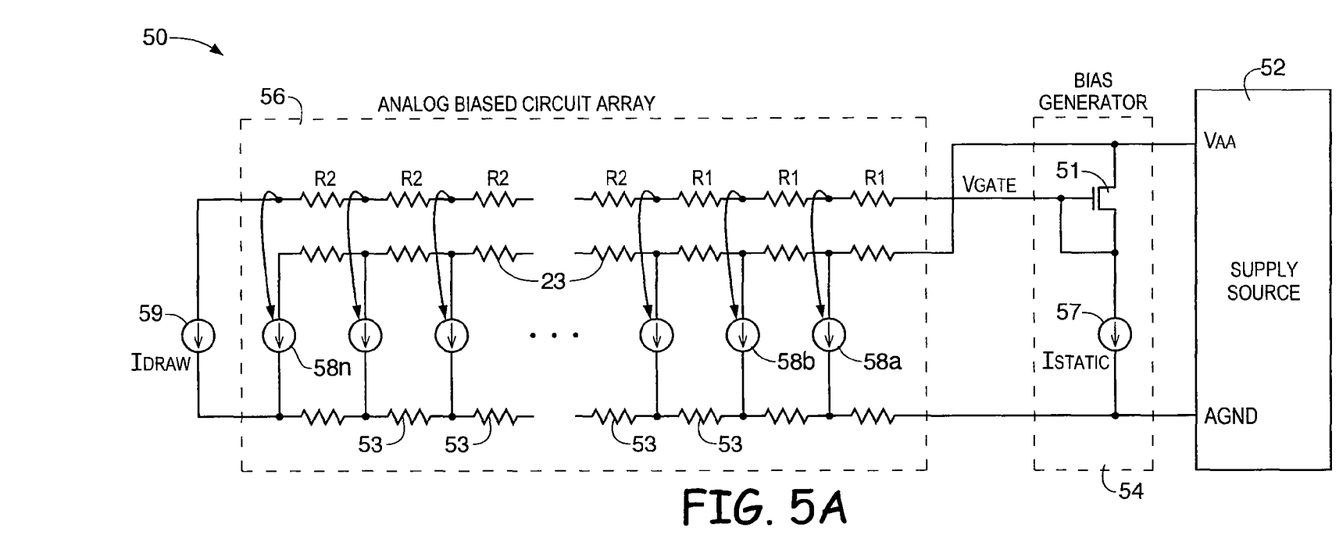
FIG. 5A is a schematic diagram of still another distributed power supply delivery network, in which the Vgate and/or Vcas routes, along the length of the current delivery route(s), more closely matches the IR voltage drop profile of the power supply, in accordance with still another example of the present invention.

Another example of a biasing network is shown in FIG. 5A, which scales the resistance of the Vgate and/or Vcas routes along the length of the route to more closely match the non-linear IR voltage drop profile of the power supply. An example of a two-segmented resistance route is shown in FIG. 5A. In this example, the series connected resistors R1 are larger than the series connected resistors R2, such that the IR voltage drop through the Vgate route is stronger earlier in the route (moving away from bias generator 54). This matches the behavior of the distributed power delivery IR voltage drop in the analog biased circuit array 56.

The more resistor value segments (R1, R2, R3, etc.) that are used in the route (Vgate and/or Vcas), the more accurately the IR voltage drop in the bias matches the IR voltage drop in circuit array 56. The furthest extension of this is to have an infinite number of resistor value segments, whereby the route resistance is continuously changing from one end of the route to the other end, while moving away from bias generator 54.

Still referring to FIG. 5A, there is shown a distributed power supply delivery network, generally designated as 50, in accordance with another example of the present invention. As shown, network 50 includes supply source 52, bias generator 54, analog bias circuit array 56, and a separate current source 59, where the latter is shown disposed adjacent an end of circuit array 56. The other current source, namely current source 57 is disposed adjacent the other end of circuit array 56.

A resistive network of series connected resistors R1 are shown coupled between bias generator 54 and current source 59 (Idraw). As in the previously described networks, it will be understood that resistors 53 may include resistor devices, or may simply be the sheet resistance of the metal routed between the ends of current sources 58a through 58n.

Figure 5B:
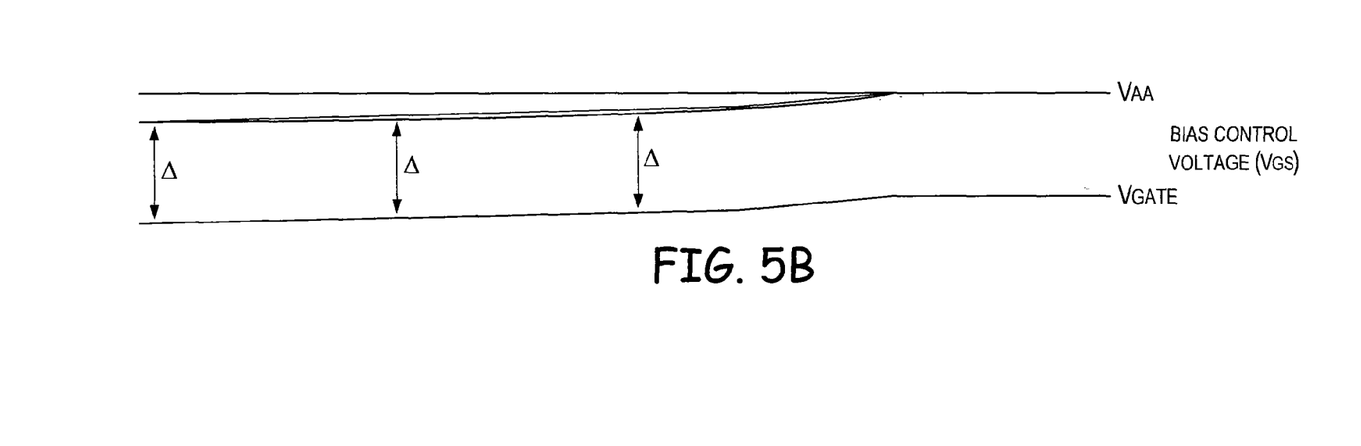
FIG. 5B is a plot of bias control voltage (Vgs) depicting a voltage difference that stays substantially uniform, as one moves away from the bias generator shown in FIG. 5A.

Referring next to FIG. 5B, there is shown a profile of the voltage difference ($\Delta$) between the supply source voltage V$_{AA}$ and gate voltage Vgate. As shown, the bias control voltage (Vgs) is substantially uniform as one moves from right to left in the figure.

Figure 6A:
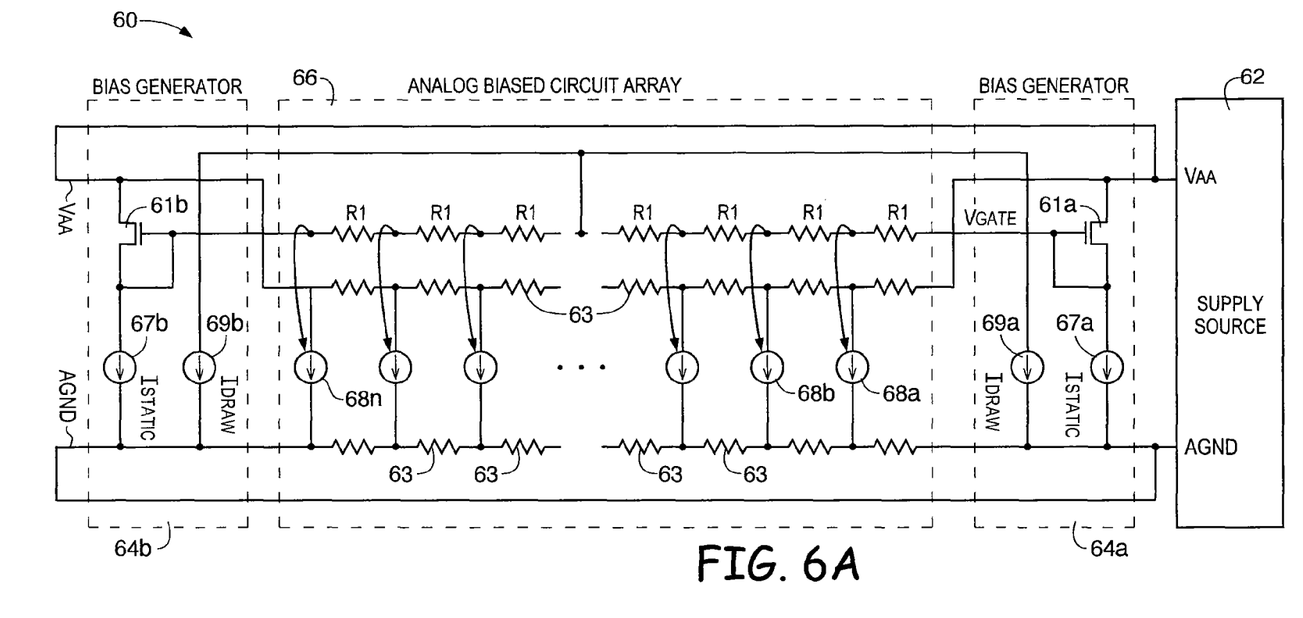
FIG. 6A is a schematic diagram of yet another distributed power supply delivery network, in which the power delivery route is from multiple directions, in accordance with yet another example of the present invention.

For arrays with a power delivery routes arriving from multiple directions, another example of a biasing system may be employed, as shown in FIG. 6A. Assuming that the power is supplied equally from two opposing sides of the analog biased circuit array, then the current Idraw may be provided from an approximate center of the circuit array. This sets up an IR voltage drop in the Vgate route that matches a "lowest in the middle" profile of this type of power distribution network.

Still referring to FIG. 6A, there is shown a distributed power supply delivery network, generally designated as 60, in accordance with yet another example of the present invention. As shown, network 60 includes supply source 62, bias generator 64a disposed at one end of analog biased circuit array 66, and another bias generator 64b disposed at the other end of analog biased circuit array 66. The analog biased circuit array includes a resistive ladder of series connected resistors 63 and multiple current sources 68a through 68n. The supply source 62 provides power to both bias generators 64a and 64b.

Bias generator 64a includes MOSFET transistor 61a and current sources 67a (Istatic) and 69a (Idraw). In a similar configuration, bias generator 64b includes MOSFET transistor 61b and current sources 67b (Istatic) and 69b (Idraw). It will be understood that current source 69a and current source 69b draw respective currents from the approximate center of the analog biased circuit array 66.

Figure 6B:
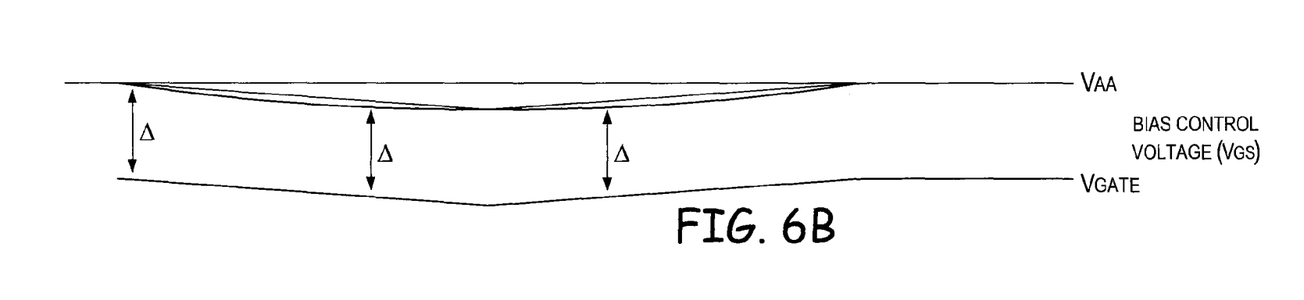
FIG. 6B is a plot of bias control voltage (Vgs) depicting a voltage difference that stays substantially uniform, as one moves away from the center of the analog biased circuit array shown in FIG. 6A.

Referring next to FIG. 6B, there is shown a profile of the voltage difference (Δ) between the supply source voltage $V_{AA}$ and the gate voltage Vgate, as one moves away from the bias generator. As shown, the $V_{AA}$ voltage profile is reduced the most at the approximate center of the figure and similarly the voltage Vgate profile is reduced the most at the same approximate center. As such, the voltage difference (Δ), or the bias control voltage Vgs is maintained uniformly across the biased circuit array 66.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A distributed power supply delivery network comprising:
   a bias generator for providing a control current,
   an analog biased circuit array, coupled to the bias generator, for receiving the control current and distributing a plurality of bias currents to a circuit,
   a resistive ladder distributed across the analog biased circuit array, and
   a plurality of series connected resistors separately transversing across the analog biased circuit array, wherein the plurality of series connected resistors substantially matches the resistive ladder.

2. The network of claim 1 wherein:
   the resistive ladder extends between a first end and a second end of the analog biased circuit array, forming voltage losses between the first and second ends,
   the plurality of series connected resistors separately form voltage drops between the first and second ends, and
   the voltage losses of the resistive ladder correspond to the voltage drops of the plurality of series connected resistors.

3. The network of claim 2 wherein:
   the analog biased circuit array receives, adjacent the first end, a voltage of VAA from the bias generator,
   the resistive ladder receives, adjacent the first end, a voltage of Vgate from the bias generator, and
   a substantially constant voltage difference of VAA less Vgate is maintained across the analog biased circuit array.

4. The network of claim 1 wherein
   the control current of the bias generator includes first and second current sources,
   the first current source is disposed adjacent one end of the analog biased circuit array, and
   the second current source is disposed adjacent another end of the analog biased circuit array; and
   the first current source provides current for generating a current mirror Vgate bias,
   the second current source provides current through the plurality of series connected resistors, and
   voltage drops formed across the resistive ladder match voltage drops formed across the plurality of series connected resistors.

5. The network of claim 1 wherein
   the control current of the bias generator includes first and second current sources,
   the first and second current sources are disposed adjacent one end of the analog biased circuit array; and
   the first current source provides current for generating a current mirror Vgate bias,
   the second current source provides current through a current delivery route extending to the other end of the analog biased circuit array and through the plurality of series connected resistors, and
   voltage drops formed across the resistive ladder match voltage drops formed across the plurality of series connected resistors.

6. The network of claim 1 wherein the bias generator comprises:
   a current mirror transistor having gate and drain terminals connected to the plurality of series connected resistors and connected to a current source for providing current to generate a current mirror Vgate bias for the analog biased circuit array.

7. The network of claim 1 wherein:
   the analog biased circuit array includes a plurality of current sources, wherein each current source is configured as a current mirror to distribute a bias current to a portion of the circuit,
   the resistive ladder includes first resistor elements disposed between adjacent current sources, and
   the series connected resistors include second resistor elements disposed opposite the first resistor elements.

8. The network of claim 7 wherein the first and second resistor elements include resistor devices and sheet metal resistors.

9. The network of claim 7 wherein the second resistor elements are configured to match the first resistor elements, as each transverses across the analog biased circuit array.

10. The network of claim 7 wherein the circuit comprises:
    an image sensor having columns in a pixel array,
    wherein the plurality of current sources are each connected to a respective column in the pixel array.

11. The network of claim 1 wherein:
    the bias generator includes first and second bias generators,
    the first bias generator is disposed adjacent to a first end of the analog biased circuit array,
    the second bias generator is disposed adjacent to a second end of the analog biased circuit array, and
    the first and second bias generators include separate current sources for distributing the plurality of bias currents to the circuit.

12. The network of claim 2 wherein:
    the analog biased circuit array receives, adjacent the first end, a voltage reference of ground from the bias generator, the resistive ladder receives, adjacent the first end, a voltage of Vgate from the bias generator, and
a substantially constant voltage difference between Vgate and the ground reference is maintained across the analog biased circuit array.

13. A distributed power supply delivery network comprising:
an analog biased circuit array including current sources for delivering current to a circuit,
a resistive ladder of resistor elements, wherein each resistor element is disposed between adjacent current sources, and
a tuned IR voltage drop network configured to match voltage drops across the resistive ladder.

14. The network of claim 13 wherein:
the tuned IR voltage drop network includes series connected resistor elements, and
the current sources are programmed to adjust a voltage drop across each respective resistor element.

15. The network of claim 13 including
a supply source for providing a voltage of VAA, wherein
voltage drops across the series connected resistor elements provide a first voltage profile as a function of distance from the supply source,
voltage drops across the resistive ladder provide a second voltage profile as a function of distance from the supply source, and
voltage differences between the first and second voltage profiles are substantially the same as a function of distance from the supply source.

16. The network of claim 13 wherein the tuned IR voltage drop network includes series connected resistor elements having either resistor devices or sheet metal resistances.

17. The network of claim 13 wherein the circuit comprises:
an image sensor having columns in a pixel array, wherein the current sources are each connected to a respective column in the pixel array.

18. The network of claim 13 wherein:
a first current source provides current to the analog biased circuit array, and a second current source provides current to the tuned IR voltage drop network, and
the first and second current sources are disposed at either the same end or opposite ends of the analog biased circuit array.

19. A method of distributing power to a circuit coupled to an IR voltage drop network, the method comprising:
delivering current to the circuit from a plurality of current sources that are subjected to IR voltage drops between adjacent current sources of the plurality of current sources; and
tuning the IR voltage drop network so that voltage drops across the IR voltage drop network match the IR voltage drops between the adjacent current sources.

20. The method of claim 19, further comprising:
connecting resistors in series between ends of the multiple current sources.

21. The network of claim 1, wherein the control current of the bias generator includes current generated by first and second current sources and wherein the first current source is configured to provide current for generating a current mirror bias.

* * * * *